(12) United States Patent
Zhou

(10) Patent No.: US 8,259,465 B2
(45) Date of Patent: Sep. 4, 2012

(54) CHIP CARD HOLDER AND ELECTRONIC DEVICE USING THE SAME

(75) Inventor: Ri Zhou, Shenzhen (CN)

(73) Assignees: Shenzhen Futaihong Precision Industry Co., Ltd., ShenZhen, Guangdong Province (CN); Chi Mei Communication Systems, Inc., Tu-Cheng, New Taipei (TW)

( * ) Notice: Subject to any disclaimer, the term of this patent is extended or adjusted under 35 U.S.C. 154(b) by 13 days.

(21) Appl. No.: 12/851,750

(22) Filed: Aug. 6, 2010

(65) Prior Publication Data

US 2011/0242783 A1  Oct. 6, 2011

(30) Foreign Application Priority Data

Mar. 30, 2010  (CN) .......................... 2010 1 0136063

(51) Int. Cl.
*H05K 3/00* (2006.01)

(52) U.S. Cl. ........ 361/784; 361/752; 361/737; 361/796; 439/296

(58) Field of Classification Search .................. 361/752, 361/737, 784, 796, 741, 754, 802, 807, 810; 439/296

See application file for complete search history.

(56) References Cited

U.S. PATENT DOCUMENTS

| 6,840,807 | B2* | 1/2005 | Ooya et al. ..................... 439/630 |
| 7,182,610 | B2* | 2/2007 | Lin ................................ 439/79 |
| 7,448,890 | B2* | 11/2008 | Ting ............................. 439/159 |
| 7,833,031 | B2* | 11/2010 | Hou et al. ..................... 439/155 |

* cited by examiner

Primary Examiner — Jayprakash N Gandhi
Assistant Examiner — Hung Dang
(74) Attorney, Agent, or Firm — Altis Law Group, Inc.

(57) ABSTRACT

A chip card holder is secured to a circuit board. The chip card holder comprises a hollow frame including an opening, a first board, a second board opposite to the first board, two opposite sidewalls and an end board opposite to the opening. The frame has two securing blocks protruding from the first board toward the second board and two latching blocks protruding from the end board; the securing blocks and the latching blocks are for latching the chip card holder to the circuit board.

10 Claims, 4 Drawing Sheets

CHIP CARD HOLDER AND ELECTRONIC DEVICE USING THE SAME

BACKGROUND

1. Technical Field

This exemplary disclosure generally relates to chip card holders, and particularly to chip card holders used in electronic devices.

2. Description of Related Art

Commonly, portable electronic devices such as mobile phones use chip cards retained by a holder. Typically, chip card holders are mounted to printed circuit boards by surface mounted technology. However, the process of the surface mounted technology is complicated, and can not easily allow detachment of the chip card holders from printed circuit boards after chip card holders are mounted to printed circuit boards.

Therefore, there is room for improvement within the art

BRIEF DESCRIPTION OF THE DRAWINGS

Many aspects of the exemplary chip card holder and electronic device using the chip card holder can be better understood with reference to the following drawings. The components in the various drawings are not necessarily drawn to scale, the emphasis instead being placed upon clearly illustrating the principles of the exemplary chip card holder and electronic device using the chip card holder. Moreover, in the drawings, like reference numerals designate corresponding parts throughout the diagrams.

DETAILED DESCRIPTION

In this exemplary embodiment, the chip card holder is used in an electronic device such as a mobile telephone. The mobile telephone described herein is a representation of the type of wireless communication device that may benefit from the exemplary embodiment. However, it is to be understood that the exemplary embodiment may be applied to any type of hand-held or portable device including, but not limited to, the following devices: radiotelephones, cordless phones, paging devices, personal digital assistants, portable computers, pen-based or keyboard-based handheld devices, remote control units, portable media players (such as an MP3 or DVD player) that have wireless communication capability and the like. Accordingly, any reference herein to the mobile telephone should also be considered to apply equally to other portable wireless electronic devices.

Figure 1:
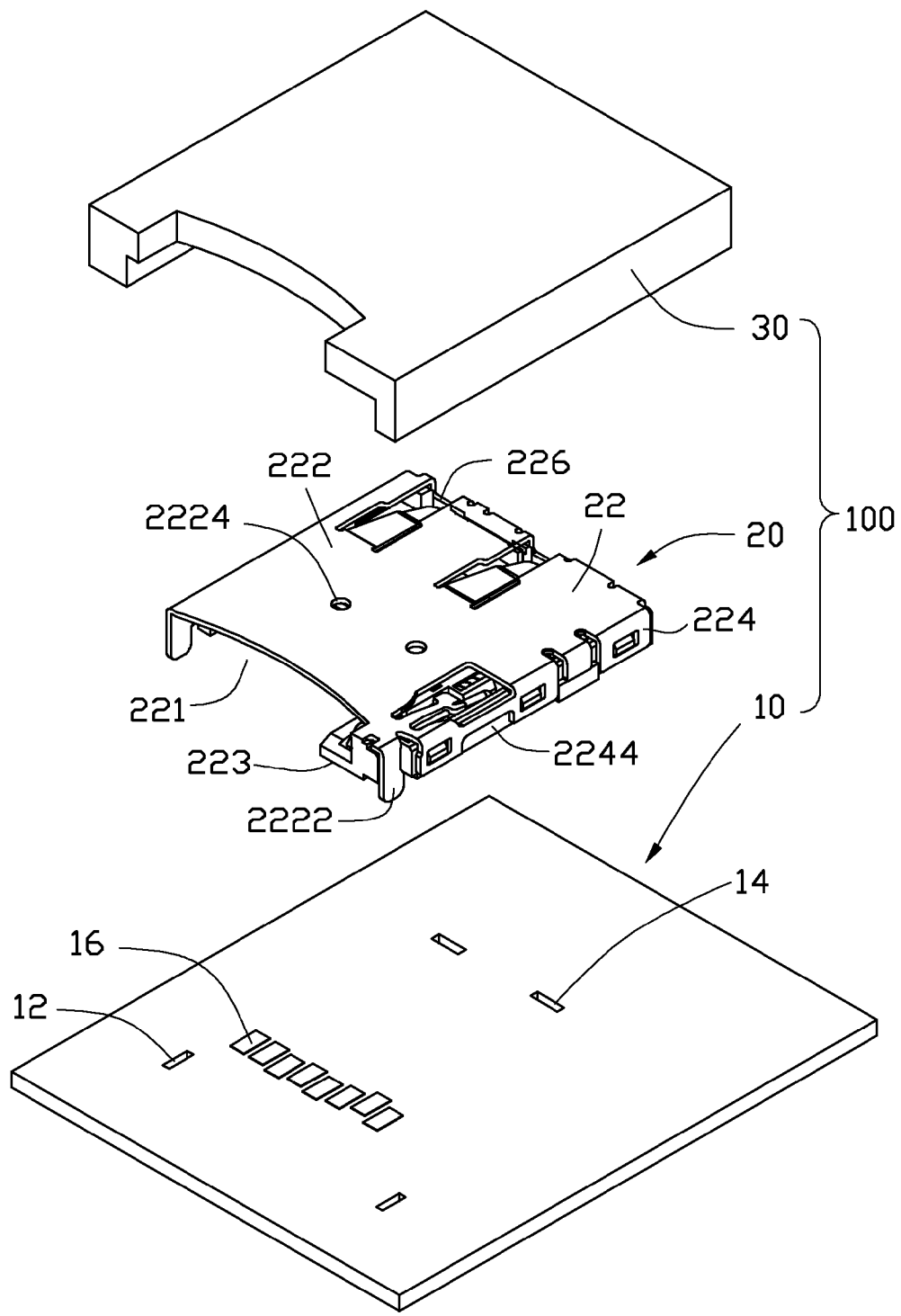
FIG. 1 is an exploded view of an electronic device with an exemplary chip card holder.
Figure 3:
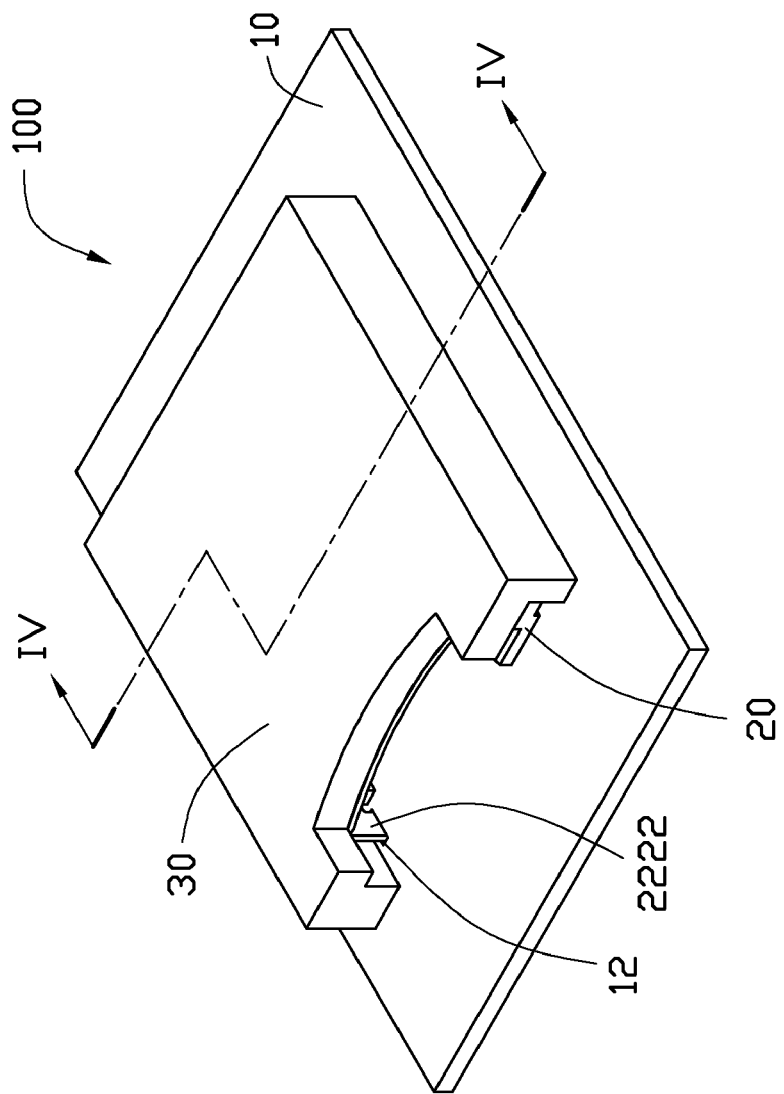
FIG. 3 is an assembled view of the electronic device shown in FIG. 1.
Figure 4:
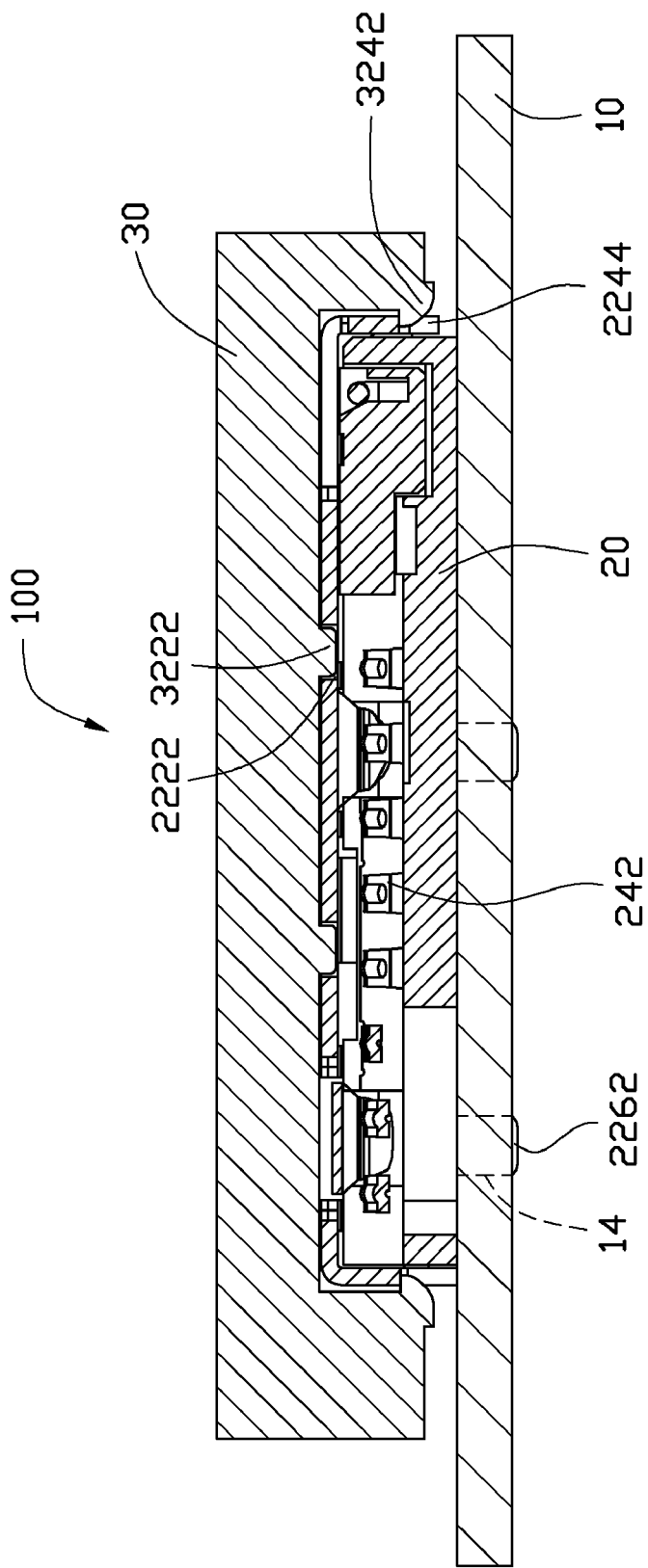
FIG. 4 is a cross-sectional view of the electronic device shown in FIG. 3 along the line IV-IV.

Referring to FIGS. 1 and 3, the electronic device 100 includes a circuit board 10, a chip card holder 20 secured to the circuit board 10, a shell 30 latched to the chip card holder 20 and a chip card (not shown) to be secured in the chip card holder 20. The circuit board 10 defines two securing slots 12 and two latching slots 14 therethrough, and the longitudinal axes of the securing slots 12 and the extending direction of the latching slots 14 are substantially perpendicular. <extra>The securing slots 12 and the latching slots 14 are for securing the chip card holder 20 to the circuit board 10. The circuit board 10 further includes a plurality of contacts 16 mounted thereof for electronically connecting the chip card holder 20 to the circuit board 10.

Figure 2:
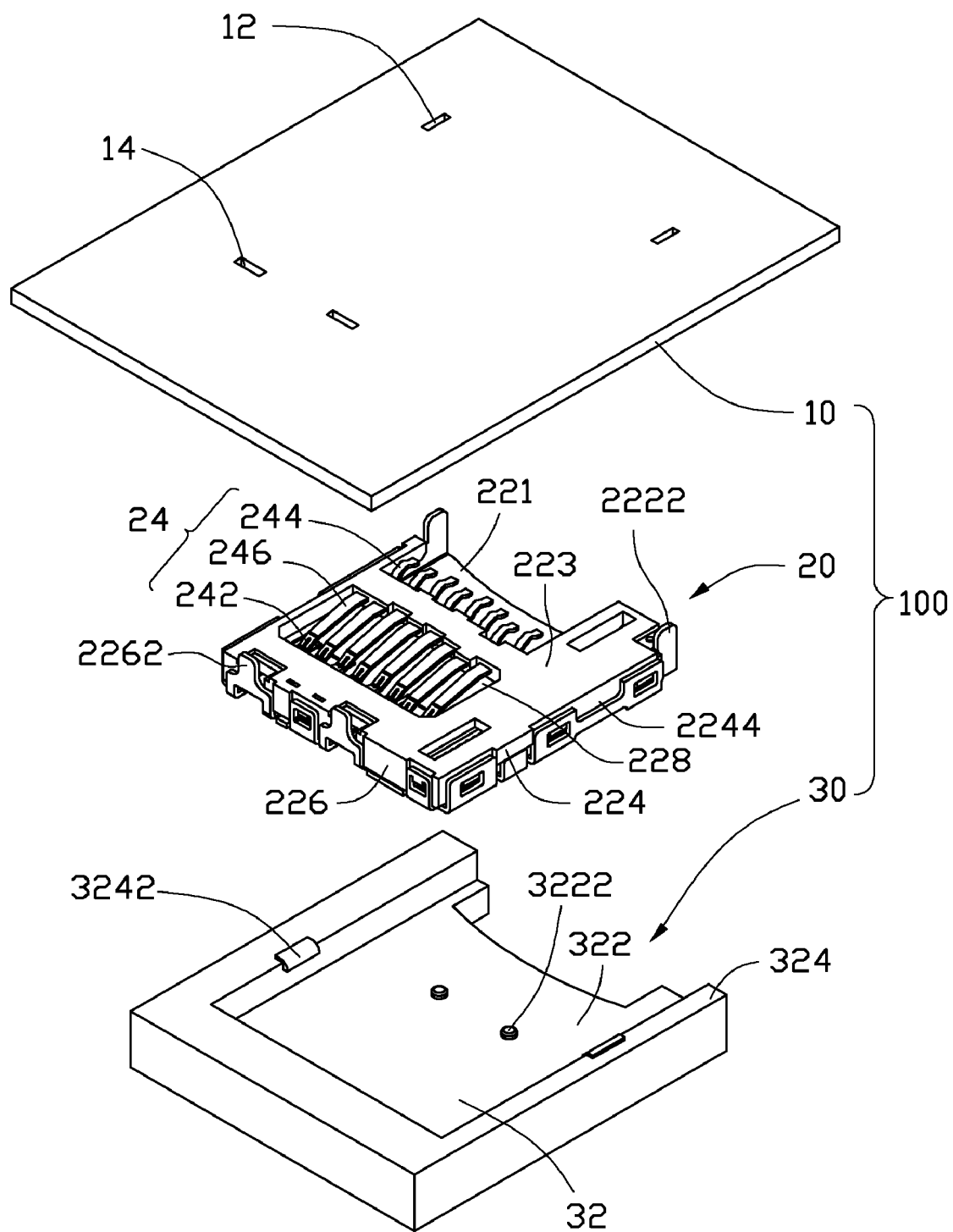
FIG. 2 is similar to FIG. 1, but showing the electronic device in another aspect.

Referring to FIGS. 1 and 2, the chip card holder 20 includes a hollow frame 22 and a plurality of elastic plates 24 spacedly mounted to the frame 22. The frame 22 includes an opening 221, a first board 222, a second board 223 opposite to the first board 222, two opposite sidewalls 224 and an end board 226 opposite to the opening 221. The first board 222, the second board 223, the sidewalls 224 and the end board 226 enclose a compartment 228 for accommodating the chip card therein. The frame 22 has two securing blocks 2222 protruding from the first board 222 toward the second board 223, and the securing blocks 2222 are located adjacent to the opening 221 in this exemplary embodiment. Each securing block 2222 tightly latches with one of the securing slots 12 to secure the chip card holder 20 to the circuit board 10. The frame 22 further has two latching blocks 2262 protruding from the end board 226. Each latching block 2262 extends into and tightly latch with one of the latching slots 14 to latch the chip card holder 20 to the circuit board 10. The first board 222 further defines two holes 2224 for latching with the shell 30. Each sidewall 224 defines a notch 2244 for latching with the shell 30.

The elastic plates 24 are mounted to the second board 223 in this exemplary embodiment. The number of the elastic plates 24 is equal to the contacts 16. Each elastic plate 24 includes a contacting section 242, a resisting section 244 and a connecting section 246 connecting the contacting section 242 with the resisting section 244. The contacting sections 242 are located in the compartment 228 for electrically connecting to the chip card. Each resisting section 244 is for connecting one of the contacts 16 when the chip card holder 20 is secured to the circuit board 10.

The shell 30 defines a receptacle 32 for accommodating the chip card holder 20. The shell 30 has two protrusions 3222 protruding from a bottom surface 322 of the receptacle 32 and two catches 3242 respectively positioning at two opposite side surfaces 324 of the receptacle 32. Each protrusion 3222 latches with one of the holes 2224 and each catch 3242 latches with one of notches 2244 so the chip card holder 20 is firmly held in the receptacle 32.

Referring to FIGS. 1-4, in assembly, each protrusion 3222 is latched in one of the holes 2224 and each catch 3242 is latched in one of the notches 2244 so the chip card holder 20 is held in the receptacle 32. The securing blocks 2222 are aligned with the securing slots 12 and the latching blocks 2262 are aligned with the latching slots 14. The circuit board 10 is pushed toward the chip card holder 20 until the securing blocks 2222 are tightly latched in the securing slots 12 and the latching blocks 2262 are tightly latched in the latching slots 14, to finish assembly of the electronic device 100. At this time, each resisting portion 244 resists one of the contacts 16.

As said above, the chip card holder 20 can be secured to the circuit board 10 only by tightly latching the securing blocks 2222 in the securing slots 12 and tightly latching the latching blocks 2262 in the latching slots 14. Thus, the chip card holder 20 can easily mount to the circuit board 10. Additionally, to detach the chip card holder 20 from the circuit board 10, the chip card holder 20 is pulled away from the circuit board 10 until the securing blocks 2222 slide out of the securing slots 12 and the latching blocks 2262 slide out of the latching slots 14, so the chip card holder 20 is detached from the circuit board 10. Furthermore, the extending direction of the securing slots 12 and the extending direction of the latching slots 14 are intersected, so when the securing blocks 2222 are latched in the securing slots 12 and the latching blocks 2262 are latched in the latching slots 14, the chip card holder 20 can be firmly mounted to the circuit board 10.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. An electronic device, comprising:
   a circuit board defining two securing slots and two latching slots therethrough; and
   a chip card holder comprising a hollow frame which includes an opening, a first board, a second board opposite to the first board, two opposite sidewalls and an end board opposite to the opening;
   a shell defining a receptacle for accommodating the chip card holder;
   wherein the frame further has two securing blocks protruding from the first board toward the second board and two latching blocks protruding from the end board; each securing block latches in one of the securing slots and each latching block latches in one of the latching slots to latch the chip card holder to the circuit board; the shell has two protrusions protruding from an bottom surface of the receptacle; the first board further defines two holes, each hole latches with one of the protrusions so the chip card holder is secured in the receptacle.

2. The electronic device as claimed in claim 1, wherein the extending direction of the securing slots are intersected with the extending direction of the latching slots.

3. The electronic device as claimed in claim 1, wherein the securing blocks are located adjacent to the opening.

4. The electronic device as claimed in claim 1, wherein the first board, the second board, the sidewalls and the end board enclose a compartment.

5. The electronic device as claimed in claim 1, wherein the shell further has two catches respectively positioning at two opposite side surfaces of the receptacle; each sidewall defines a notch for latching with one of the catches to secure the chip card holder in the receptacle.

6. The electronic device as claimed in claim 2, wherein the extending direction of the securing slots is perpendicular to the extending direction of the latching slots.

7. An electronic device, comprising:
   a circuit board defining two securing slots and two latching slots therethrough; and
   a chip card holder comprising a hollow frame which includes an opening, a first board, a second board opposite to the first board, two opposite sidewalls and an end board opposite to the opening;
   a shell defining a receptacle for accommodating the chip card holder;
   wherein the frame further has two securing blocks protruding from the first board toward the second board and two latching blocks protruding from the end board; the extending direction of the securing blocks are intersected with the extending direction of the latching blocks; the chip card holder is latched to the circuit board only by the latching engagement of the securing blocks and the securing slots, and the latching engagement of the latching blocks and the latching slots; the shell has two protrusions protruding from an bottom surface of the receptacle; the first board further defines two holes, each hole latches with one of the protrusions so the chip card holder is secured in the receptacle.

8. The electronic device as claimed in claim 7, wherein the securing blocks are located adjacent to the opening.

9. The electronic device as claimed in claim 7, wherein the first board, the second board, the sidewalls and the end board enclose a compartment.

10. The electronic device as claimed in claim 7, wherein the shell further has two catches respectively positioning at two opposite side surfaces of the receptacle; each sidewall defines a notch for latching with one of the catches to secure the chip card holder in the receptacle.

* * * * *